(12) United States Patent
Scheffelin et al.

(10) Patent No.: US 6,350,013 B1
(45) Date of Patent: Feb. 26, 2002

(54) CARRIER POSITIONING FOR WIDE-ARRAY INKJET PRINTHEAD ASSEMBLY

(75) Inventors: Joseph E. Scheffelin, Poway, CA (US); Melissa D. Boyd, Corvallis; James W. Ring, Blodgett, both of OR (US); Mohammad Akhavain, Escondido; Janis Horvath, San Diego, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/648,121

(22) Filed: Aug. 25, 2000

Related U.S. Application Data

(63) Continuation-in-part of application No. 09/216,606, filed on Dec. 17, 1998, which is a continuation-in-part of application No. 08/959,376, filed on Oct. 28, 1997, now Pat. No. 6,123,410.

(51) Int. Cl.[7] ............................................... B41J 2/155
(52) U.S. Cl. ........................................... 347/49; 347/42
(58) Field of Search ............................... 347/37, 42, 43, 347/49

(56) References Cited

U.S. PATENT DOCUMENTS

| | | | |
|---|---|---|---|
| 5,016,023 A | 5/1991 | Chan et al. .................. 346/1.1 |
| 5,057,854 A | 10/1991 | Pond et al. ................... 347/42 |
| 5,079,189 A | 1/1992 | Drake et al. ................. 437/209 |
| 5,098,503 A | 3/1992 | Drake ......................... 156/299 |
| 5,160,945 A | 11/1992 | Drake ........................... 347/42 |
| 5,696,544 A | 12/1997 | Komuro ....................... 347/50 |
| 5,719,605 A | 2/1998 | Anderson et al. ............. 347/59 |
| 5,742,305 A | 4/1998 | Hackleman ................... 347/42 |
| 5,755,024 A | 5/1998 | Drake et al. .................. 29/611 |
| 5,946,012 A | 8/1999 | Courian et al. ............... 347/63 |
| 6,070,965 A * | 6/2000 | Fujimoto ...................... 347/50 |
| 6,234,605 B1 * | 5/2001 | Hilton .......................... 347/42 |

OTHER PUBLICATIONS

Allen, R., "Ink Jet Printing with Large Pagewide Arrays: Issues and Challenges", Recent Progress in Ink jet Technologies II, pp. 114–120, No Date.

* cited by examiner

Primary Examiner—Anh T. N. Vo

(57) ABSTRACT

An inkjet printing system includes a mounting assembly and an inkjet printhead assembly. The mounting assembly includes a plurality of datums and the inkjet printhead assembly includes a carrier and a plurality of printhead dies each mounted on the carrier. The inkjet printhead assembly is mounted in the mounting assembly such that the carrier contacts at least one of the datums. Thus, positioning of the carrier relative to the mounting assembly is established.

43 Claims, 6 Drawing Sheets

CARRIER POSITIONING FOR WIDE-ARRAY INKJET PRINTHEAD ASSEMBLY

CROSS-REFERENCE TO RELATED APPLICATIONS

This application is a Continuation-in-Part of U.S. patent application Ser. No. 09/216,606, entitled "Multilayered Ceramic Substrate Serving as Ink Manifold and Electrical Interconnection Platform for Multiple Printhead Dies" filed on Dec. 17, 1998, assigned to the assignee of the present invention, and incorporated herein by reference which is a Continuation-in-Part of Ser. No. 08/959,376 filed Oct. 28, 1997, now U.S. Pat. No. 6,123,410. This application is related to U.S. patent application Ser. No. 09/648,566, entitled "Printhead Die Alignment for Wide-Array Inkjet Printhead Assembly" filed on Aug. 25, 2000, assigned to the assignee of the present invention, and incorporated herein by reference.

THE FIELD OF THE INVENTION

The present invention relates generally to inkjet printheads, and more particularly to a wide-array inkjet printhead assembly.

BACKGROUND OF THE INVENTION

A conventional inkjet printing system includes a printhead and an ink supply which supplies liquid ink to the printhead. The printhead ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other. Typically, a mounting assembly and a media transport assembly establish relative positioning and movement of the printhead and the print medium, respectively.

In one arrangement, commonly referred to as a wide-array inkjet printing system, a plurality of individual printheads, also referred to as printhead dies, are mounted on a single carrier so as to create a wide-array inkjet printhead assembly. As such, a number of nozzles and, therefore, an overall number of ink drops which can be ejected per second is increased. Since the overall number of drops which can be ejected per second is increased, printing speed can be increased with the wide-array inkjet printing system.

Positioning of the wide-array inkjet printhead assembly, however, requires proper alignment between the carrier of the printhead dies and the mounting assembly. Misalignment between the carrier and the mounting assembly can adversely affect performance of the inkjet printing system. Misalignment between the carrier and the mounting assembly, for example, can result in ink drop trajectory errors, printing swath gaps, and/or pen-to-paper spacing problems which degrade print quality. Thus, in order to avoid misalignment between the carrier and the mounting assembly, relative positioning between the inkjet printhead assembly and mounting assembly should be controlled.

Accordingly, a need exists for controlling relative positioning of a wide-array inkjet printhead assembly which includes a plurality of printhead dies mounted on a single carrier.

SUMMARY OF THE INVENTION

One aspect of the present invention provides an inkjet printing system. The inkjet printing system includes a mounting assembly including a plurality of datums and an inkjet printhead assembly mounted in the mounting assembly. The inkjet printhead assembly includes a carrier contacting at least one of the plurality of datums and a plurality of printhead dies each mounted on the carrier.

In one embodiment, the plurality of datums includes a first datum and a second datum spaced from the first datum. As such, the carrier of the inkjet printhead assembly is mounted between and contacts the first datum and the second datum.

In one embodiment, the plurality of datums includes a first pair of datums and a second pair of datums spaced from the first pair of datums. As such, the carrier of the inkjet printhead assembly is mounted between and contacts the first pair of datums and the second pair of datums. In one embodiment, the second pair of datums is offset from the first pair of datums.

In one embodiment, the mounting assembly includes a first carriage rail and a second carriage rail opposed to and spaced from the first carriage rail, wherein the first carriage rail and the second carriage rail each include at least one datum of the plurality of datums. As such, the carrier of the inkjet printhead assembly is mounted between the first carriage rail and the second carriage rail and contacts the at least one datum of each of the first carriage rail and the second carriage rail.

In one embodiment, the carrier has a first side and a second side parallel with the first side. As such, the first side of the carrier contacts the at least one datum of the first carriage rail and the second side of the carrier contacts the at least one datum of the second carriage rail. In one embodiment, the carrier has a third side and a fourth side both oriented at an angle to the first side and the second side of the carrier. As such, the third side of the carrier contacts the at least one datum of the first carriage rail and the fourth side of the carrier contacts the at least one datum of the second carriage rail.

In one embodiment, the carrier includes a first notch formed in the first side thereof and a second notch formed in the second side thereof. As such, the first notch receives the at least one datum of the first carriage rail and the second notch receives the at least one datum of the second carriage rail. In one embodiment, the carrier includes a first flange projecting from the first side thereof and a second flange projecting from the second side thereof. As such, the first flange contacts the at least one datum of the first carriage rail and the second flange contacts the at least one datum of the second carriage rail.

In one embodiment, the at least one datum of the first carriage rail includes a portion projecting from the first carriage rail toward the second carriage rail and the at least one datum of the second carriage rail includes a portion projecting from the second carriage rail toward the first carriage rail.

In one embodiment, the inkjet printhead assembly also includes a second carrier and a second plurality of printhead dies each mounted on the second carrier. As such, at least one of the plurality of datums or a pair of the plurality of datums is interposed between and contacts the first named carrier and the second carrier.

Another aspect of the present invention provides a method of forming an inkjet printing system. The method includes providing a mounting assembly including a plurality of datums, providing an inkjet printhead assembly including a carrier and a plurality of printhead dies each mounted on the carrier, and mounting the carrier in the mounting assembly and contacting at least one of the plurality of datums.

Another aspect of the present invention provides a mounting assembly. The mounting assembly includes a carriage adapted to receive a carrier having a plurality of inkjet printhead dies mounted thereon and a plurality of datums formed on the carriage. As such, the plurality of datums are adapted to position the carrier relative to the carriage.

Another aspect of the present invention provides a method of forming a mounting assembly. The method includes providing a carriage adapted to receive a carrier having a plurality of inkjet printhead dies mounted thereon and forming a plurality of datums on the carriage. As such, the plurality of datums are adapted to position the carrier relative to the carriage.

Another aspect of the present invention provides an inkjet printhead assembly adapted to be mounted in a mounting assembly including a plurality of datums. The inkjet printhead assembly includes a carrier and a plurality of printhead dies each mounted on the carrier. The carrier is adapted to contact at least one of the plurality of datums of the mounting assembly and position the inkjet printhead assembly in three dimensions relative to the mounting assembly.

In one embodiment, the present invention provides a wide-array inkjet printing system which includes a plurality of datums which establish relative positioning of a carrier having a plurality of printhead dies mounted thereon.

BRIEF DESCRIPTION OF THE DRAWINGS

FIG. 7A is a top perspective view of another embodiment of an inkjet printhead assembly according to the present invention;

FIG. 7B is a top perspective view of another embodiment of a portion of a mounting assembly according to the present invention;

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. The inkjet printhead assembly and related components of the present invention can be positioned in a number of different orientations. As such, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
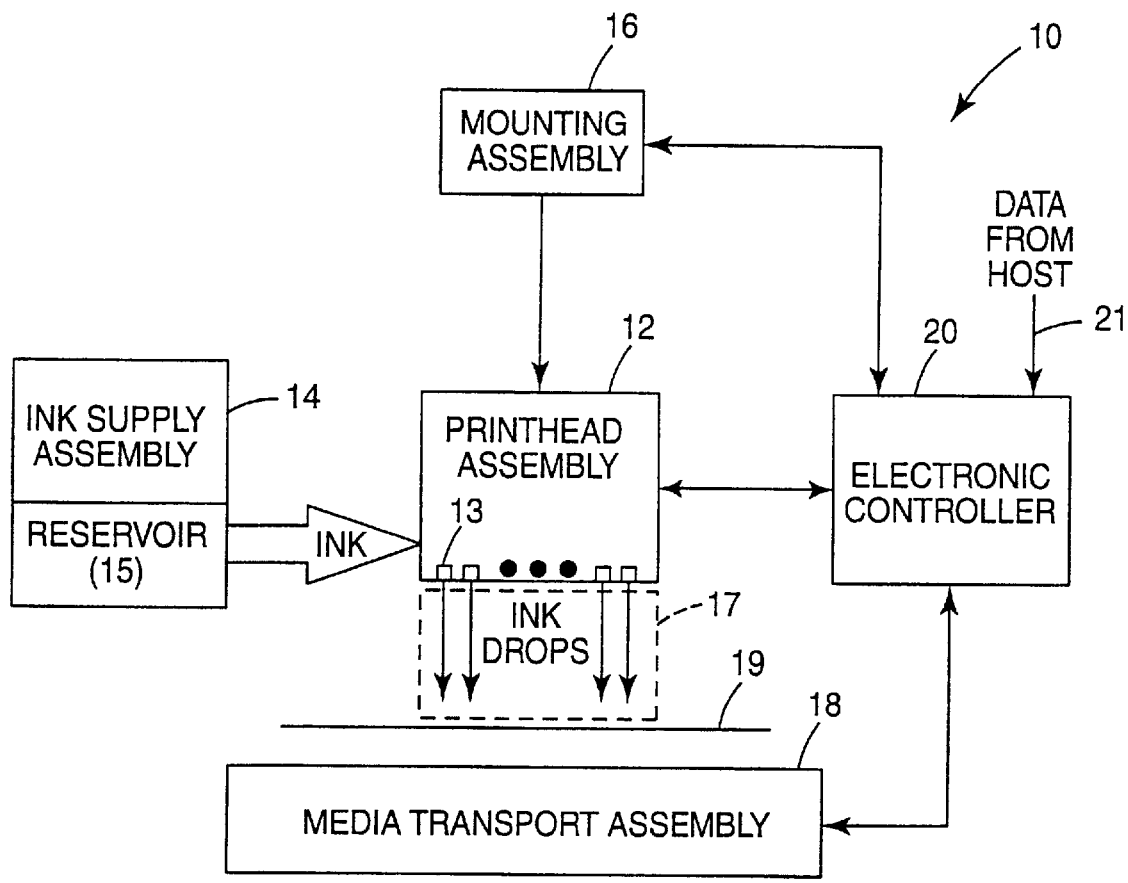
FIG. 1 is a block diagram illustrating one embodiment of an inkjet printing system according to the present invention.

FIG. 1 illustrates one embodiment of an inkjet printing system 10 according to the present invention. Inkjet printing system 10 includes an inkjet printhead assembly 12, an ink supply assembly 14, a mounting assembly 16, a media transport assembly 18, and an electronic controller 20. Inkjet printhead assembly 12 is formed according to an embodiment of the present invention, and includes one or more printheads which eject drops of ink through a plurality of orifices or nozzles 13 and toward a print medium 19 so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes characters, symbols, and/or other graphics or images to be printed upon print medium 19 as inkjet printhead assembly 12 and print medium 19 are moved relative to each other.

Ink supply assembly 14 supplies ink to printhead assembly 12 and includes a reservoir 15 for storing ink. As such, ink flows from reservoir 15 to inkjet printhead assembly 12. Ink supply assembly 14 and inkjet printhead assembly 12 can form either a one-way ink delivery system or a re-circulating ink delivery system. In a one-way ink delivery system, substantially all of the ink supplied to inkjet printhead assembly 12 is consumed during printing. In a re-circulating ink delivery system, however, only a portion of the ink supplied to printhead assembly 12 is consumed during printing. As such, ink not consumed during printing is returned to ink supply assembly 14.

In one embodiment, inkjet printhead assembly 12 and ink supply assembly 14 are housed together in an inkjet cartridge or pen. In another embodiment, ink supply assembly 14 is separate from inkjet printhead assembly 12 and supplies ink to inkjet printhead assembly 12 through an interface connection, such as a supply tube. In either embodiment, reservoir 15 of ink supply assembly 14 may be removed, replaced, and/or refilled. In one embodiment, where inkjet printhead assembly 12 and ink supply assembly 14 are housed together in an inkjet cartridge, reservoir 15 includes a local reservoir located within the cartridge as well as a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly. As such, mounting assembly 16 includes a carriage for moving inkjet printhead assembly 12 relative to media transport assembly 18 to scan print medium 19. In another embodiment, inkjet printhead assembly 12 is a non-scanning type printhead assembly. As such, mounting assembly 16 fixes inkjet printhead assembly 12 at a prescribed position relative to media transport assembly 18. Thus, media transport assembly 18 positions print medium 19 relative to inkjet printhead assembly 12.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops, is determined by the print job commands and/or command parameters. In one embodiment, logic and drive circuitry forming a portion of electronic controller 20 is located on inkjet printhead assembly 12. In another embodiment, logic and drive circuitry is located off inkjet printhead assembly 12.

Figure 2:
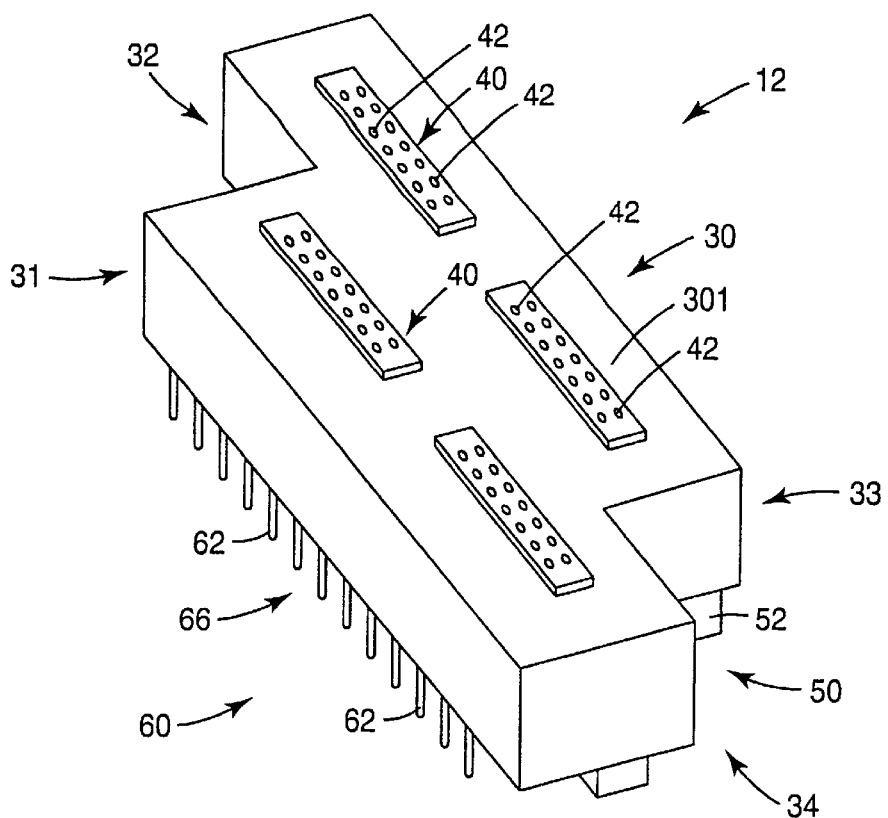
FIG. 2 is a top perspective view of an inkjet printhead assembly including a plurality of printhead dies according to the present invention.
Figure 3:
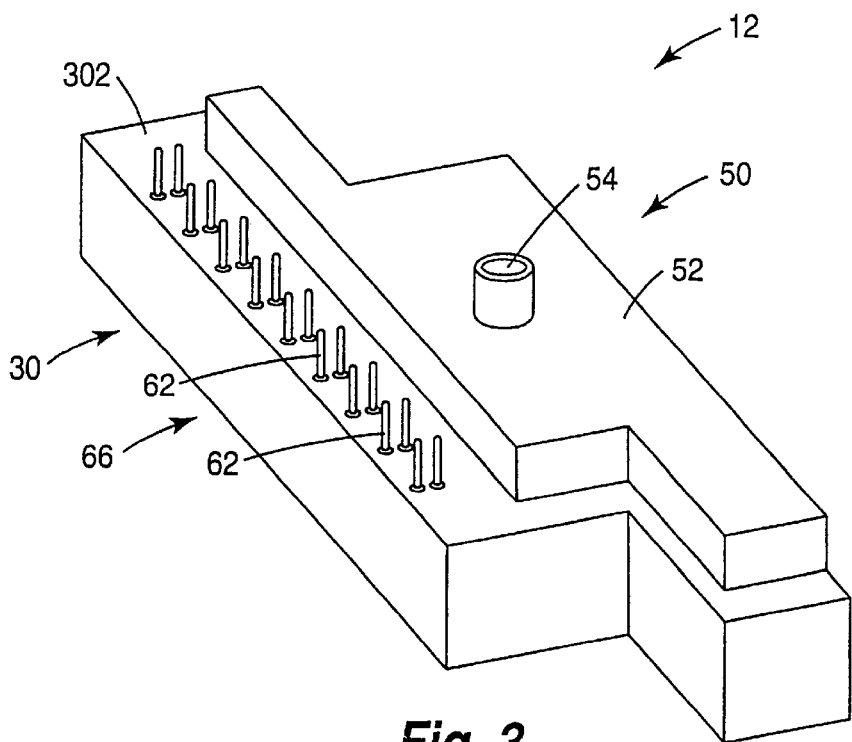
FIG. 3 is a bottom perspective view of the inkjet printhead assembly of FIG. 2.

FIGS. 2 and 3 illustrate one embodiment of a portion of inkjet printhead assembly 12. Inkjet printhead assembly 12 is a wide-array or multi-head printhead assembly and includes a carrier 30, a plurality of printhead dies 40, an ink delivery system 50, and an electronic interface system 60. Carrier 30 serves to carry printhead dies 40 and provide electrical and fluidic communication between printhead dies 40, ink supply assembly 14, and electronic controller 20.

Carrier 30 has an exposed surface or first face 301 and an exposed surface or second face 302 which is opposed to and oriented substantially parallel to first face 301. Carrier 30 also includes sides 31, 32, 33, and 34. Sides 31 and 33 are oriented substantially parallel to each other and sides 32 and 34 are oriented at an angle to sides 31 and 33. In one embodiment, sides 32 and 34 are oriented substantially parallel to each other. In addition, sides 32 and 34 are oriented at an angle of approximately 90 degrees to sides 31 and 33 (shown in FIGS. 8 and 9) or at an angle other than approximately 90 degrees to sides 31 and 33 (shown in FIG. 10).

Printhead dies 40 are mounted on first face 301 of carrier 30 and aligned in one or more rows. Each printhead die 40 has a first axis 401 extending from side-to-side, as oriented in the accompanying figures, and a second axis 402. Second axis 402 extends substantially perpendicular to first axis 401 and, in one embodiment, is oriented substantially parallel with a scanning axis of inkjet printhead assembly 12.

In one embodiment, printhead dies 40 are arranged in one or more overlapping rows, as oriented in the accompanying figures. Printhead dies 40 of inkjet printhead assembly 12 are arranged, for example, in a first row 403 and a second row 404. Second row 404 is spaced from and oriented substantially parallel to first row 403. Printhead dies 40 in first row 403 are offset from printhead dies 40 in second row 404 such that each printhead die 40 in first row 403 overlaps at least one printhead die 40 in second row 404 with respect to first axis 401. Thus, inkjet printhead assembly 12 may span a nominal page width or a width shorter or longer than nominal page width. While four printhead dies 40 are illustrated as being mounted on carrier 30, the number of printhead dies 40 mounted on carrier 30 may vary.

Ink delivery system 50 fluidically couples ink supply assembly 14 with printhead dies 40. In one embodiment, ink delivery system 50 includes a manifold 52 and a port 54. Manifold 52 is mounted on second face 302 of carrier 30 and distributes ink through carrier 30 to each printhead die 40. Port 54 communicates with manifold 52 and provides an inlet for ink supplied by ink supply assembly 14.

Electronic interface system 60 electrically couples electronic controller 20 with printhead dies 40. In one embodiment, electronic interface system 60 includes a plurality of electrical or input/output (I/O) contacts 62. I/O contacts 62 are provided on second face 302 of carrier 30 and communicate electrical signals between electronic controller 20 and printhead dies 40 through carrier 30. Examples of I/O contacts 62 include I/O pins which engage corresponding I/O receptacles electrically coupled to electric controller 20 and I/O contact pads or fingers which contact corresponding electrical nodes electrically coupled to electronic controller 20.

Figure 4:
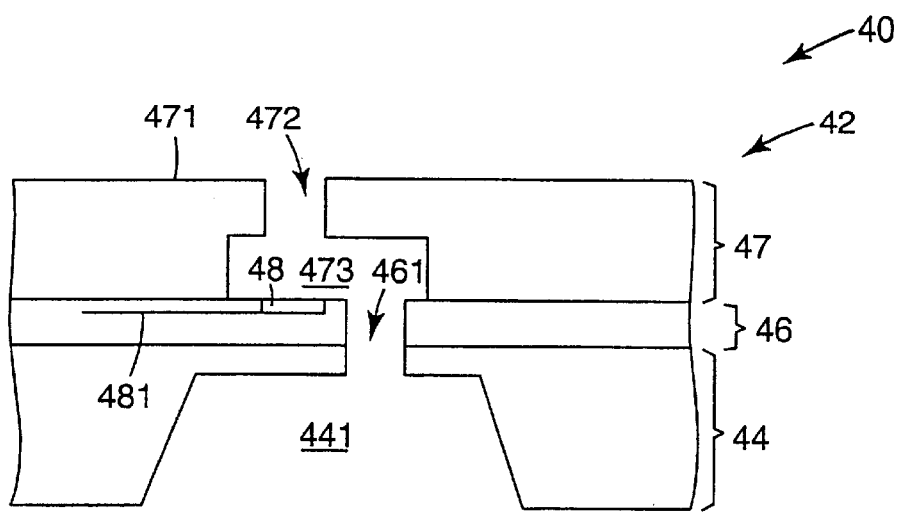
FIG. 4 is a schematic cross-sectional view illustrating portions of a printhead die according to the present invention.

As illustrated in FIGS. 2 and 4, each printhead die 40 includes an array of printing or drop ejecting elements 42. Printing elements 42, also referred to as nozzles, are formed on a substrate 44 which has an ink feed slot 441 formed therein. As such, ink feed slot 441 provides a supply of liquid ink to printing elements 42. Each printing element 42 includes a thin-film structure 46, an orifice layer 47, and a firing resistor 48. Thin-film structure 46 has an ink feed channel 461 formed therein which communicates with ink feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and ink feed channel 461 of thin-film structure 46. Firing resistor 48 is positioned within nozzle chamber 473 and includes leads 481 which electrically couple firing resistor 48 to a drive signal and ground.

During printing, ink flows from ink feed slot 441 to nozzle chamber 473 via ink feed channel 461. Nozzle opening 472 is operatively associated with firing resistor 48 such that droplets of ink within nozzle chamber 473 are ejected through nozzle opening 472 (e.g., normal to the plane of firing resistor 48) and toward a print medium upon energization of firing resistor 48.

Example embodiments of printhead dies 40 include a thermal printhead, a piezoelectric printhead, a flex-tensional printhead, or any other type of inkjet ejection device known in the art. In one embodiment, printhead dies 40 are fully integrated thermal inkjet printheads. As such, substrate 44 is formed, for example, of silicon, glass, or a stable polymer and thin-film structure 46 is formed by one or more passivation or insulation layers of silicon dioxide, silicon carbide, silicon nitride, tantalum, poly-silicon glass, or other suitable material. Thin-film structure 46 also includes a conductive layer which defines firing resistor 48 and leads 481. The conductive layer is formed, for example, by aluminum, gold, tantalum, tantalum-aluminum, or other metal or metal alloy.

Figure 5:
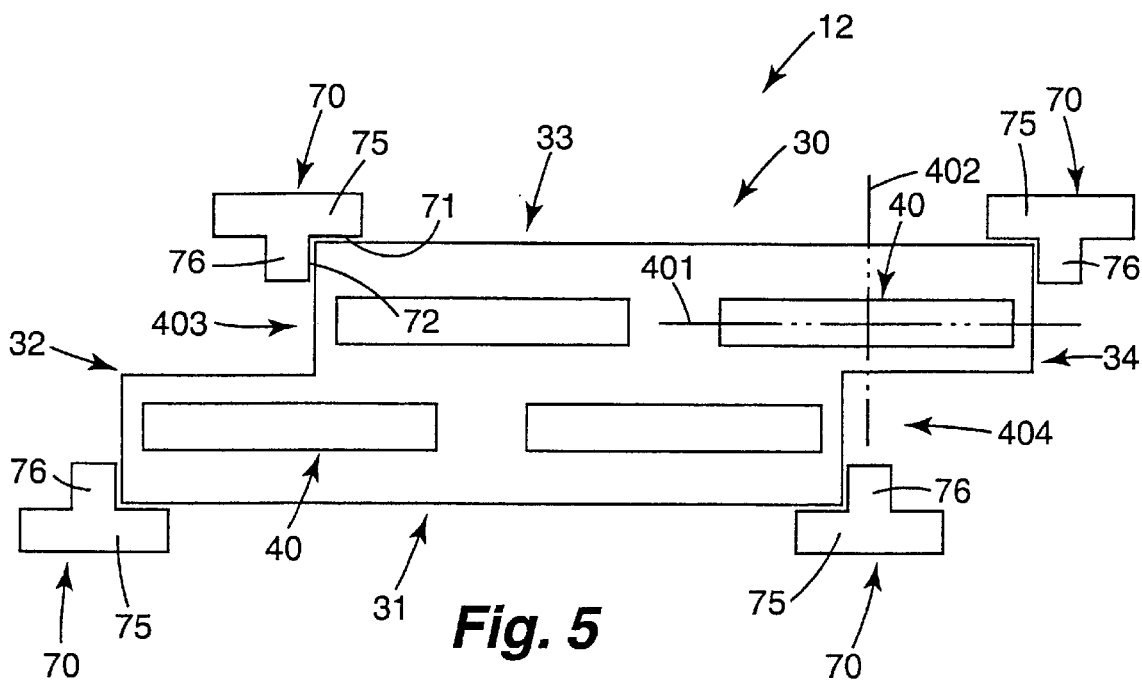
FIG. 5 is a schematic plan view of an inkjet printhead assembly and a plurality of positioning datums according to the present invention.
Figure 6A:
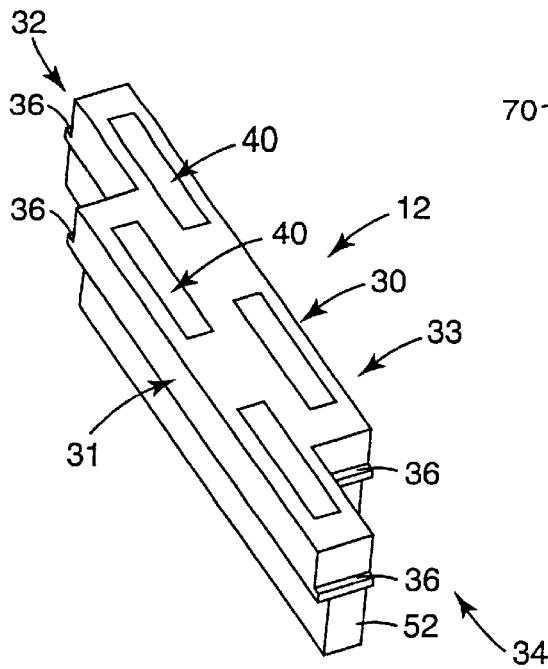
FIG. 6A is a top perspective view of one embodiment of an inkjet printhead assembly according to the present invention.
Figure 6B:
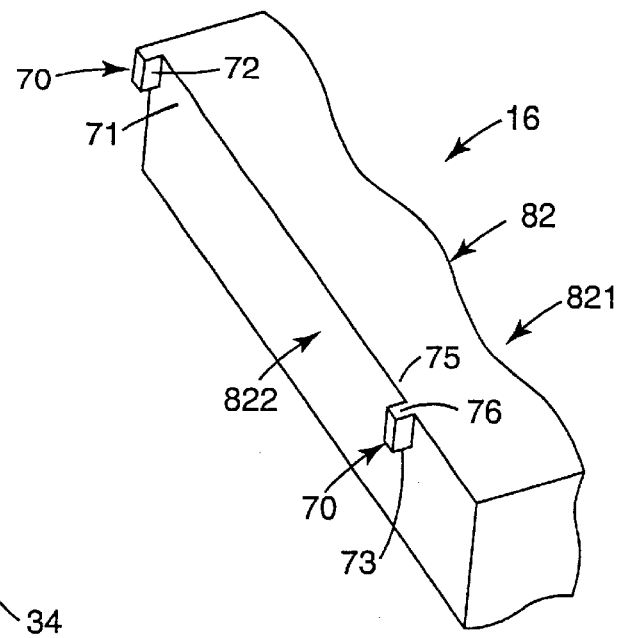
FIG. 6B is a top perspective view of one embodiment of a portion of a mounting assembly according to the present invention.
Figure 6C:
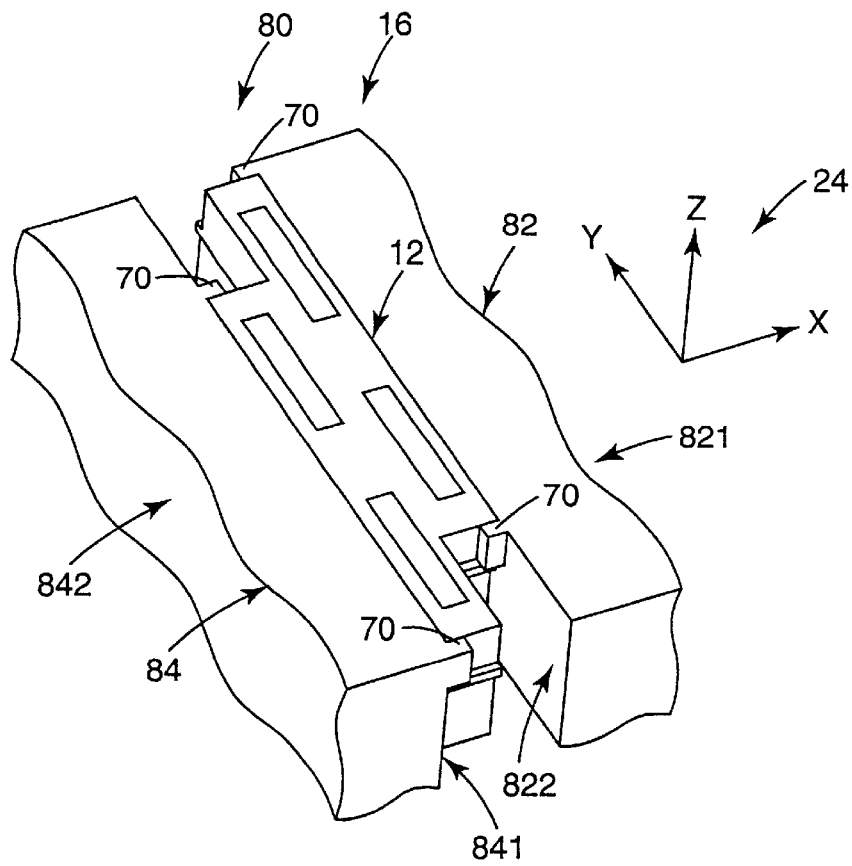
FIG. 6C is a top perspective view of the inkjet printhead assembly of FIG. 6A mounted in the mounting assembly of FIG. 6B.
Figure 7C:
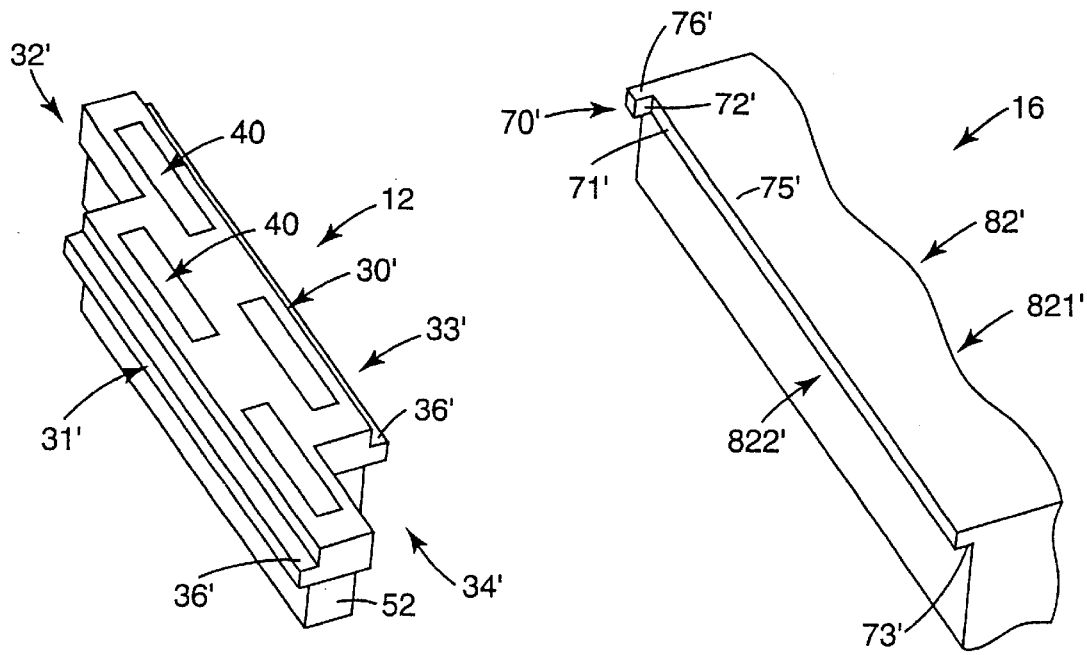
FIG. 7C is a top perspective view of the inkjet printhead assembly of FIG. 7A mounted the mounting assembly of FIG. 7B.
Figure 7C:
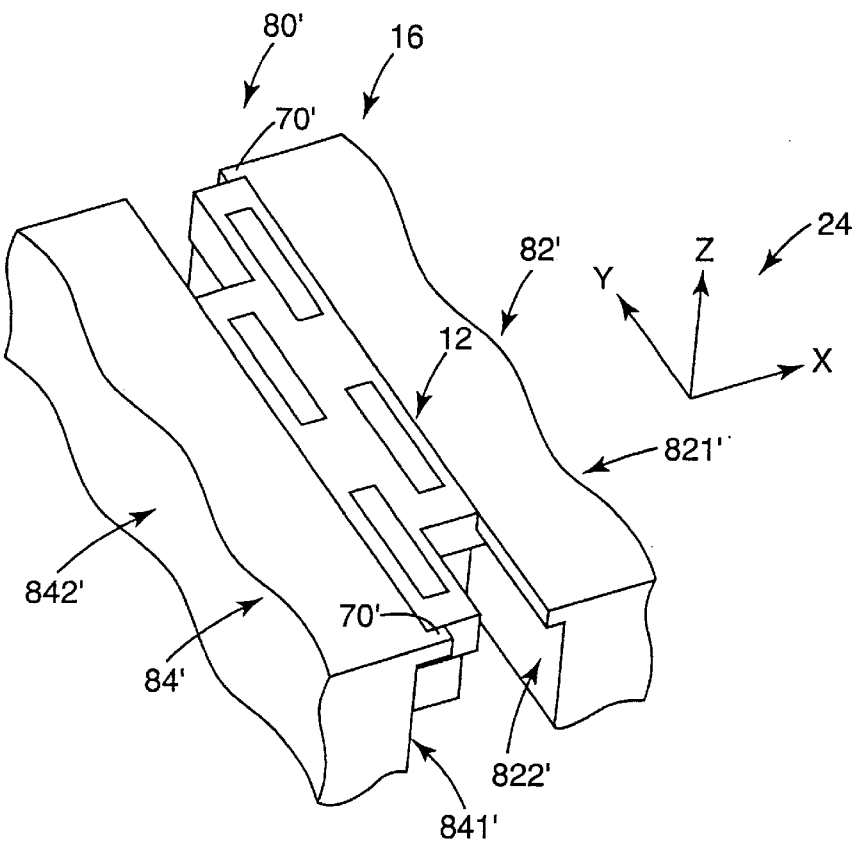

Referring to FIGS. 5–7, inkjet printhead assembly 12 has an x-axis in an x dimension, a y-axis in a y dimension, and a z-axis in a z dimension, as indicated by arrows 24. In one embodiment, the x-axis represents a scanning axis of inkjet printhead assembly 12 and the y-axis represents a paper axis of inkjet printhead assembly 12. More specifically, the x-axis extends in a direction coinciding with relative side-to-side movement of inkjet printhead assembly 12 during printing and the y-axis extends in a direction coinciding with relative advancement between print medium 19 and inkjet printhead assembly 12 during printing.

The z-axis of inkjet printhead assembly 12 extends in a direction substantially perpendicular to front face 471 of printhead dies 40. More specifically, the z-axis extends in a direction coinciding with ink drop ejection from printhead dies 40 during printing. Thus, spacing between inkjet printhead assembly 12 and print medium 19, referred to as pen-to-paper spacing, is measured along the z-axis. Pen-to-paper spacing, therefore, is controlled by relative positioning of inkjet printhead assembly 12 along the z-axis.

As described above, mounting assembly 16 positions inkjet printhead assembly 12 relative to media transport assembly 18. As such, inkjet printhead assembly 12 is mounted within and positioned relative to mounting assembly 16. Mounting assembly 16, therefore, positions inkjet printhead assembly 12 with reference to the x-axis, the y-axis, and the z-axis thereof.

To position inkjet printhead assembly 12 in x, y, and z dimensions, mounting assembly 16 includes a plurality of datums 70. Datums 70 establish reference points for positioning of inkjet printhead assembly 12 within mounting assembly 16. Datums 70 include an x-datum 71, a y-datum 72, and a z-datum 73. As such, inkjet printhead assembly 12 contacts datums 70 and, more specifically, x-datum 71, y-datum 72, and z-datum 73, when inkjet printhead assembly 12 is mounted within mounting assembly 16. Thus, x-datum 71, y-datum 72, and z-datum 73 position inkjet printhead assembly 12 relative to mounting assembly 16 along the x-axis, the y-axis, and the z-axis, respectively, of inkjet printhead assembly 12.

Datums 70 are illustrated schematically as being generally T-shaped or generally L-shaped. Datums 70, therefore, include a base portion 75 and a projection portion 76 which projects from base portion 75. In one embodiment, base portion 75 of datums 70 extends along sides 31 and 33 of carrier 30 while projection portion 76 of datums 70 extends along sides 32 and 34 of carrier 30. As such, base portion 75 of datums 70 establishes x-datum 71 and projection portion 76 of datums 70 establishes y-datum 72. Z-datum 73 is established as described below. While datums 70 are illustrated schematically as being generally T-shaped or generally L-shaped, it is within the scope of the present invention for datums 70 to be of other shapes, schemes, and/or configurations.

In one embodiment, datums 70 are established adjacent to first face 301 of carrier 30 upon which printhead dies 40 are mounted. As such, x-datum 71, y-datum 72, and z-datum 73 are established adjacent to a plane established by front face 471 of printhead dies 40. Relative positioning of carrier 30, therefore, is controlled near a plane established by printhead dies 40. Thus, z-datum 73, for example, establishes a relative planarity of carrier 30 and, more specifically, printhead dies 40.

In one embodiment, mounting assembly 16 includes a carriage 80. Carriage 80 includes a first carriage rail 82 and a second carriage rail 84. First carriage rail 82 and second carriage rail 84 each include a first side 821 and 841, respectively, and a second side 822 and 842, respectively. First side 821 and second side 822 of first carriage rail 82 are opposite each other, and first side 841 and second side 842 of second carriage rail 84 are opposite each other. First carriage rail 82 and second carriage rail 84 are opposed to and spaced from each other such that second side 822 of first carriage rail 82 faces first side 841 of second carriage rail 84.

Inkjet printhead assembly 12 is mounted within carriage 80 such that carrier 30 is positioned between first carriage rail 82 and second carriage rail 84. In one embodiment, first carriage rail 82 and second carriage rail 84 each include at least one datum 70. Carrier 30 contacts datums 70 of first carriage rail 82 and second carriage rail 84 when mounted within carriage 80. As such, carriage 80 provides support for inkjet printhead assembly 12 while datums 70 control positioning of inkjet printhead assembly 12 relative to carriage 80.

In one embodiment, datums 70 constitute portions of carriage 80 and, more specifically, first carriage rail 82 and second carriage rail 84. For example, base portion 75 of datums 70 extends along and is formed by second side 822 of first carriage rail 82 and first side 841 of second carriage rail 84. Thus, projection portion 76 of datums 70 projects from second side 822 of first carriage rail 82 and first side 841 of second carriage rail 84. Projection portion 76, therefore, projects from first carriage rail 82 toward second carriage rail 84 and second carriage rail 84 toward first carriage rail 82. While datums 70 are illustrated as being formed integrally with carriage 80 and, more specifically, first carriage rail 82 and second carriage rail 84, it is within the scope of the present invention for datums 70 to be formed separately from and then secured to carriage 80.

FIGS. 6A, 6B, and 6C illustrate one embodiment of carrier 30 of inkjet printhead assembly 12 and one embodiment of datums 70 and carriage 80 of mounting assembly 16. Carrier 30 includes sides 31, 32, 33, and 34 while carriage 80 includes first carriage rail 82 and second carriage rail 84. First carriage rail 82 and second carriage rail 84 each include a pair of datums 70. In one embodiment, sides 32 and 34 are stepped and datums 70 of first carriage rail 82 are offset from datums 70 of second carriage rail 84 with respect to the y-axis. In addition, carrier 30 includes a flange 36 projecting from and formed along sides 32 and 34.

Carrier 30 is mounted within carriage 80 and, more specifically, between first carriage rail 82 and second carriage rail 84. In addition, carrier 30 is positioned between and contacts datums 70 of first carriage rail 82 and datums 70 of second carriage rail 84. More specifically, sides 31, 32, and 34 of carrier 30 contact datums 70 of first carriage rail 82, and sides 33, 32, and 34 of carrier 30 contact datums 70 of second carriage rail 84. Therefore, sides 31 and 33 contact base portion 75 of datums 70 and sides 32 and 34 contact projection portion 76 of datums 70. In addition, flange 36 of sides 32 and 34 contacts projection portion 76 of datums 70. As such, base portion 75 establishes x-datum 71 and projection portion 76 establishes y-datum 72 and z-datum 73. Thus, base portion 75 of datums 70 positions carrier 30 along the x-axis and projection portion 76 of datums 70 positions carrier 30 along the y-axis and the z-axis.

FIGS. 7A, 7B, and 7C illustrate another embodiment of carrier 30 of inkjet printhead assembly 12 and another embodiment of datums 70 and carriage 80 of mounting assembly 16. Carrier 30' includes sides 31', 32', 33', and 34' while carriage 80' includes first carriage rail 82' and second carriage rail 84'. First carriage rail 82' and second carriage rail 84' each include at least one datum 70'. In one embodiment, sides 32' and 34' are stepped and sides 31' and 33' each have notch 36' extending along and formed therein.

Carrier 30' is mounted within carriage 80' and, more specifically, between first carriage rail 82' and second carriage rail 84'. In addition, carrier 30' is positioned between and contacts datum 70' of first carriage rail 82' and datum 70' of second carriage rail 84'. More specifically, sides 31', 32', and 34' of carrier 30' contact datum 70' of first carriage rail 82', and sides 33', 32', and 34' of carrier 30' contact datum 70' of second carriage rail 84'. Therefore, sides 31' and 33' contact base portion 75' of datums 70' and sides 32' and 34' contact projection portion 76' of datums 70'. In addition, notch 36' of sides 31' and 33' receives base portion 75' of datums 70. As such, base portion 75' establishes x-datum 71' and z-datum 73', and projection portion 76' establishes y-datum 72'. Thus, base portion 75' of datums 70' positions carrier 30' along the x-axis and the z-axis, and projection portion 76' of datums 70' positions carrier 30' along the y-axis.

Figure 8:
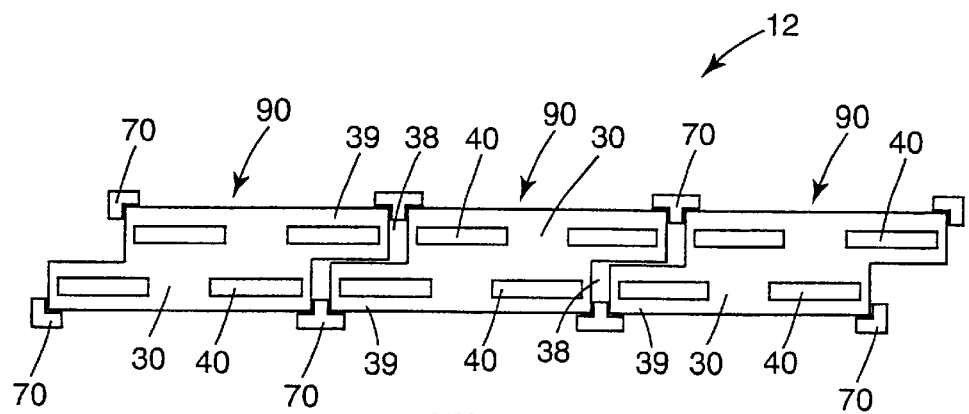
FIG. 8 is a schematic plan view of one embodiment of a plurality of inkjet printhead modules according to the present invention.
Figure 9:
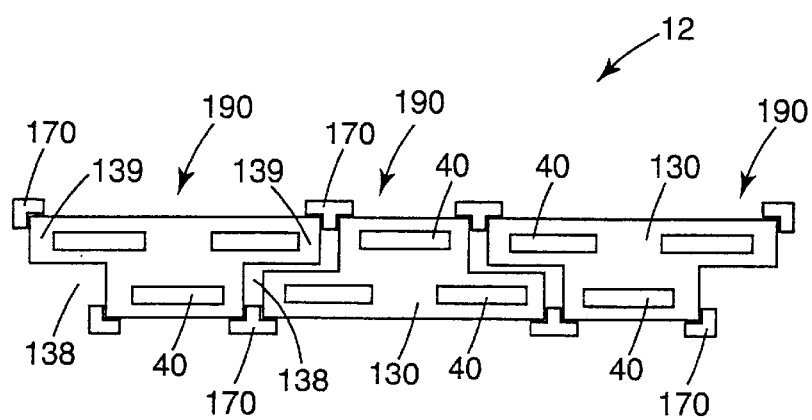
FIG. 9 is a schematic plan view of another embodiment of a plurality of inkjet printhead modules according to the present invention.
Figure 10:
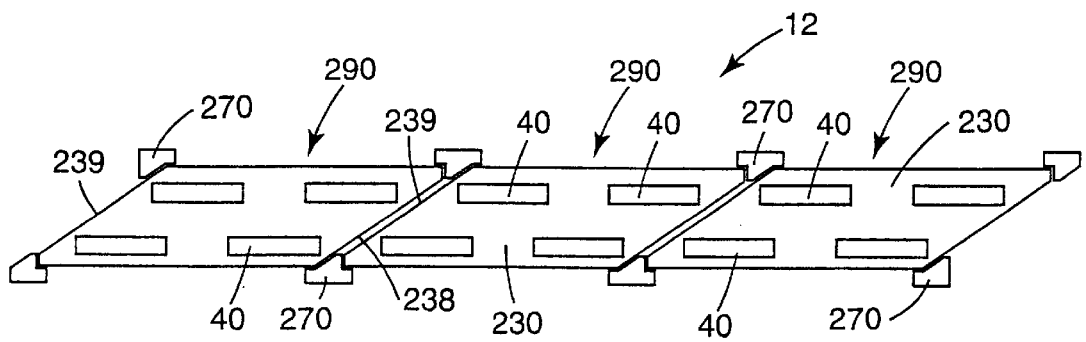
FIG. 10 is a schematic plan view of another embodiment of a plurality of inkjet printhead modules according to the present invention.

In one embodiment, as illustrated in FIGS. 8–10, inkjet printhead assembly 12 is formed of a plurality of inkjet printhead modules 90. Each inkjet printhead module 90 includes a plurality of printhead dies 40 mounted on a separate carrier 30. Inkjet printhead modules 90 are arranged such that each inkjet printhead module 90 overlaps adjacent inkjet printhead modules 90. In addition, each inkjet printhead module 90 is formed so as to ensure effective overlap both between printhead dies 40 mounted on one carrier 30 and between printhead dies 40 of adjacent inkjet printhead modules 90 such as described in detail in the above-incorporated U.S. patent application Ser. No. 09/648,566.

Inkjet printhead modules 90 are stacked in an end-to-end manner such that positioning of inkjet printhead modules 90 relative to each other is established by datums 70. More specifically, at least one datum 70 is interposed between adjacent inkjet printhead modules 90. In one embodiment, one base portion 75 of at least one datum 70 establishes x-datum 71 for two adjacent inkjet printhead modules 90 and one projection portion 76 of at least one datum 70 establishes y-datum 72 for two adjacent inkjet printhead modules 90. Z-datum 73 is established as described above. In addition, individual inkjet printhead modules 90 are positioned relative to carriage 80 and, more specifically, carriage rail 82 and carriage rail 84 as described above.

FIG. 8 illustrates one embodiment of inkjet printhead modules 90. Inkjet printhead modules 90 each include carrier 30 and printhead dies 40 mounted on carrier 30. Carrier 30 is generally S-shaped. To create the generally S-shape, carrier 30 includes stepped sides 32 and 34 formed by rectangular end notches 38 at two diagonal corners. Thus, rectangular legs 39 are formed at two opposite diagonal corners.

Inkjet printhead modules 90 are stacked in an end-to-end manner such that rectangular notch 38 of one inkjet printhead module 90 accommodates rectangular leg 39 of an adjacent inkjet printhead module 90. Accordingly, an extended array of interleaved or overlapping inkjet printhead modules 90 is formed. As such, a compact and narrow arrangement of inkjet printhead modules 90 which preserves a width of a single carrier 30 is provided. More specifically, a continuity of overlapping rows 403 and 404 of printhead dies 40, with respect to first axis 401, is maintained between adjacent inkjet printhead modules 90. Thus, a need for over-scanning with the inkjet printhead assembly 12 to accommodate additional offset rows of printhead dies 40 is reduced. While three inkjet printhead modules 90 are illustrated as being stacked in an end-to-end manner, the number of inkjet printhead modules 90 may vary depending on a desired length of inkjet printhead assembly 12.

Inkjet printhead modules 90 are positioned relative to each other and relative to carriage 80 by datums 70 as described above. Thus, at least one datum 70 is interposed between and contacts carrier 30 of adjacent inkjet printhead modules 90. A plurality of datums 70, therefore, are formed along and by each carriage rail 82 and 84. Since inkjet printhead modules 90 are stacked in an end-to-end manner and formed of an interleaved or overlapping structure, datums 70 are formed and arranged in opposing linear and offset patterns relative to each other. Interleaved inkjet printhead modules 90, therefore, are datummed relative to each other. In addition, inkjet printhead modules 90 include an even number of printhead dies 40 which are arranged on carrier 30 such that at least one printhead die 40 of each inkjet printhead module 90 overlaps at least one printhead die of an adjacent inkjet printhead module 90.

FIG. 9 illustrates another embodiment of inkjet printhead modules 90. Inkjet printhead modules 190 each include a carrier 130 and printhead dies 40 mounted on carrier 130. Carrier 130 is generally T-shaped. To create the generally T-shape, carrier 130 is formed with rectangular end notches 138 at two opposite corners. Thus, rectangular legs 139 are formed at two opposite corners.

Inkjet printhead modules 190 are stacked in an end-to-end manner with every other inkjet printhead module 190 inverted such that rectangular notch 138 of one inkjet printhead module 190 accommodates rectangular leg 139 of an adjacent inkjet printhead module 190. Accordingly, an extended array of interleaved or overlapping inkjet printhead modules 190 is formed. As such, a compact and narrow arrangement of inkjet printhead modules 190 is provided similar to that of inkjet printhead modules 90 as described above.

Inkjet printhead modules 190 are positioned relative to each other and relative to carriage 80 by datums 170 in a manner similar to that of inkjet printhead modules 90 as described above. Thus, at least one datum 170 is interposed between and contacts carrier 130 of adjacent inkjet printhead modules 190 and datums 170 are formed and arranged in opposing linear and offset patterns relative to each other. Inkjet printhead modules 190 include an odd number of printhead dies 40 which are arranged on carrier 130 such that at least one printhead die 40 of each inkjet printhead module 190 overlaps at least one printhead die 40 of another inkjet printhead module 190.

FIG. 10 illustrates another embodiment of inkjet printhead modules 90. Inkjet printhead modules 290 each include a carrier 230 and printhead dies 40 mounted on carrier 230. Carrier 230 is of a generally parallelogram shape and has a leading edge 238 and a trailing edge 239 opposite to and parallel with leading edge 238.

Inkjet printhead modules 290 are stacked in an end-to-end manner such that leading edge 238 of one inkjet printhead module 290 follows trailing edge 239 of an adjacent inkjet printhead module 290. Accordingly, an extended array of interleaved or overlapping inkjet printhead modules 290 is formed. As such, a compact and narrow arrangement of inkjet printhead modules 290 is provided similar to that of inkjet printhead modules 90 as described above.

Inkjet printhead modules 290 are positioned relative to each other and relative to carriage 80 by datums 270 in a manner similar to that of inkjet printhead modules 90 as described above. Thus, at least one datum 270 is interposed between and contacts carrier 230 of adjacent inkjet printhead modules 290 and datums 270 are formed and arranged in opposing linear and offset patterns relative to each other. Inkjet printhead modules 290 include an even number of printhead dies 40 which are arranged on carrier 230 such that at least one printhead die 40 of each inkjet printhead module 290 overlaps at least one printhead die 40 of another inkjet printhead module 290.

By contacting datums 70 of mounting assembly 16, carrier 30 positions inkjet printhead assembly 12 relative to mounting assembly 16. As such, datums 70 control positioning of inkjet printhead assembly 12 in x, y, and z dimensions. Thus, positioning of inkjet printhead assembly 12 relative to mounting assembly 16 and print medium 19 is established. Misalignment between inkjet printhead assembly 12, mounting assembly 16, and print medium 19, therefore, is avoided. In addition, by forming inkjet printhead modules 90 with an interleaved or overlapping structure and interposing at least one datum 70 between adjacent inkjet printhead modules 90, controlled positioning of a compact and narrow arrangement of inkjet printhead modules 90 in x, y, and z dimensions is provided.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An inkjet printing system, comprising:
   a mounting assembly including a plurality of datums; and
   an inkjet printhead assembly mounted in the mounting assembly, the inkjet printhead assembly including a carrier having two sides both contacting a one of the plurality of datums and a plurality of printhead dies each mounted on the carrier.

2. The inkjet printing system of claim 1, wherein the plurality of datums includes a first datum and a second datum spaced from the first datum, and wherein the carrier of the inkjet printhead assembly is mounted between and contacts the first datum and the second datum.

3. The inkjet printing system of claim 1, wherein the plurality of datums includes a first pair of datums and a second pair of datums spaced from the first pair of datums, and wherein the carrier of the inkjet printhead assembly is mounted between and contacts the first pair of datums and the second pair of datums.

4. The inkjet printing system of claim 3, wherein the second pair of datums is offset from the first pair of datums.

5. The inkjet printing system of claim 1, wherein the mounting assembly includes a first carriage rail and a second carriage rail opposed to and spaced from the first carriage rail, the first carriage rail and the second carriage rail each including at least one datum of the plurality of datums, and wherein the carrier of the inkjet printhead assembly is mounted between the first carriage rail and the second carriage rail and contacts the at least one datum of each of the first carriage rail and the second carriage rail.

6. The inkjet printing system of claim 5, wherein the carrier has a first side and a second side parallel with the first side, the first side of the carrier contacting the at least one datum of the first carriage rail and the second side of the carrier contacting the at least one datum of the second carriage rail.

7. The inkjet printing system of claim 6, wherein the carrier further has a third side and a fourth side both oriented at an angle to the first side and the second side of the carrier, the third side of the carrier contacting the at least one datum of the first carriage rail and the fourth side of the carrier contacting the at least one datum of the second carriage rail.

8. The inkjet printing system of claim 6, wherein the carrier includes a first notch formed in the first side thereof and a second notch formed in the second side thereof, the first notch receiving the at least one datum of the first carriage rail and the second notch receiving the at least one datum of the second carriage rail.

9. The inkjet printing system of claim 6, wherein the carrier includes a first flange projecting from the first side thereof and a second flange projecting from the second side thereof, the first flange contacting the at least one datum of the first carriage rail and the second flange contacting the at least one datum of the second carriage rail.

10. The inkjet printing system of claim 5, wherein the at least one datum of the first carriage rail includes a portion projecting from the first carriage rail toward the second carriage rail and the at least one datum of the second carriage rail includes a portion projecting from the second carriage rail toward the first carriage rail.

11. The inkjet printing system of claim 1, wherein the inkjet printhead assembly further includes an additional carrier and an additional plurality of printhead dies each mounted on the additional carrier, the one of the plurality of datums being interposed between and contacting the carrier and the additional carrier.

12. The inkjet printing system of claim 1, wherein the inkjet printhead assembly further includes an additional carrier and an additional plurality of printhead dies each mounted on the additional carrier, a pair of the plurality of datums being interposed between and contacting the carrier and the additional carrier.

13. A method of forming an inkjet printing system, the method comprising the steps of:
    providing a mounting assembly including a plurality of datums;
    providing an inkjet printhead assembly including a carrier having two sides and a plurality of printhead dies each mounted on the carrier; and
    mounting the carrier in the mounting assembly and contacting a one of the plurality of datums with both of the two sides of the carrier.

14. The method of claim 13, wherein the plurality of datums includes a first datum and a second datum spaced from the first datum, and wherein the step of mounting the carrier in the mounting assembly includes mounting the carrier between and contacting the first datum and the second datum.

15. The method of claim 13, wherein the plurality of datums includes a first pair of datums and a second pair of datums spaced from the first pair of datums, and wherein the step of mounting the carrier in the mounting assembly includes mounting the carrier between and contacting the first pair of datums and the second pair of datums.

16. The method of claim 15, wherein the second pair of datums is offset from the first pair of datums.

17. The method of claim 13, wherein the mounting assembly includes a first carriage rail and a second carriage rail opposed to and spaced from the first carriage rail, the first carriage and the second carriage rail each including at least one datum of the plurality of datums, and wherein the step of mounting the carrier in the mounting assembly includes mounting the carrier between the first carriage rail and the second carriage rail and contacting the at least one datum of each of the first carriage rail and the second carriage rail.

18. The method of claim 17, wherein the carrier has a first side and a second side, and wherein the step of mounting the carrier in the mounting assembly includes contacting the at least one datum of the first carriage rail with the first side of the carrier and contacting the at least one datum of the second carriage rail with the second side of the carrier.

19. The method of claim 18, wherein the carrier further has a third side and a fourth side both oriented at an angle to the first side and the second side of the carrier, and wherein the step of mounting the carrier in the mounting assembly includes contacting the at least one datum of the first carriage rail with the third side of the carrier and contacting the at least one datum of the second carriage rail with the fourth side of the carrier.

20. The method of claim 18, wherein the carrier includes a first notch formed in the first side thereof and a second notch formed in the second side thereof, and wherein the step of mounting the carrier in the mounting assembly includes positioning the at least one datum of the first carriage rail in the first notch and positioning the at least one datum of the second carriage rail in the second notch.

21. The method of claim 18, wherein the carrier includes a first flange projecting from the first side thereof and a second flange projecting from the second side thereof, and wherein the step of mounting the carrier in the mounting assembly includes contacting the at least one datum of the first carriage rail with the first flange and contacting the at least one datum of the second carriage rail with the second flange.

22. The method of claim 17, wherein the at least one datum of the first carriage rail includes a portion projecting from the first carriage rail toward the second carriage rail and the at least one datum of the second carriage rail includes a portion projecting from the second carriage toward the first carriage rail.

23. The method of claim 13, wherein the inkjet printhead assembly further includes an additional carrier and an additional plurality of printhead dies each mounted on the additional carrier, and wherein the step of mounting the carrier in the mounting assembly includes interposing the one of the plurality of datums between the carrier and the additional carrier and contacting the one of the plurality of datums with the carrier and the additional carrier.

24. The method of claim 13, wherein the inkjet printhead assembly further includes an additional carrier and an additional plurality of printhead dies each mounted on the additional carrier, and wherein the step of mounting the carrier in the mounting assembly includes interposing a pair of the plurality of datums between the carrier and the additional carrier and contacting the pair of datums with the carrier and the additional carrier.

25. A mounting assembly, comprising:
   a carriage adapted to receive a carrier having two sides and a plurality of inkjet printhead dies mounted thereon; and
   a plurality of datums formed on the carriage, a one of the plurality of datums adapted to contact both of the two sides of the carrier and position the carrier relative to the carriage.

26. The mounting assembly of claim 25, wherein the carriage includes a first carriage rail and a second carriage rail opposed to and spaced from the first carriage rail, the first carriage rail and the second carriage rail each including at least one datum of the plurality of datums.

27. The mounting assembly of claim 26, wherein the at least one datum of the first carriage rail includes a portion projecting from the first carriage rail toward the second carriage rail and the at least one datum of the second carriage rail includes a portion projecting from the second carriage rail toward the first carriage rail.

28. The mounting assembly of claim 26, wherein the first carriage rail and the second carriage rail each have a first side and a second side opposite the first side, the at least one datum of the first carriage rail projecting from the second side thereof and the at least one datum of the second carriage rail projecting from the first side thereof.

29. The mounting assembly of claim 25, wherein the plurality of datums includes a first datum and a second datum spaced from the first datum.

30. The mounting assembly of claim 25, wherein the plurality of datums includes a first pair of datums and a second pair of datums spaced from the first pair of datums.

31. The mounting assembly of claim 30, wherein the second pair of datums is offset from the first pair of datums.

32. A method of forming a mounting assembly, the method comprising the steps of:
   providing a carriage adapted to receive a carrier having two sides and a plurality of inkjet printhead dies mounted thereon; and
   forming a plurality of datums on the carriage, a one of the plurality of datums adapted to contact both of the two sides of the carrier and position the carrier relative to the carriage.

33. The method of claim 32, wherein the carriage includes a first carriage rail and a second carriage rail opposed to and spaced from the first carriage rail, and wherein the step of forming the plurality of datums includes forming at least one datum on the first carriage rail and the second carriage rail.

34. The method of claim 33, wherein the step of forming the plurality of datums includes projecting a portion of the at least one datum of the first carriage rail toward the second carriage rail and projecting a portion of the at least one datum of the second carriage rail toward the first carriage rail.

35. The method of claim 33, wherein the first carriage rail and the second carriage rail each have a first side and a second side opposite the first side, and wherein the step of forming the plurality of datums includes projecting the at least one datum of the first carriage rail from the second side thereof and projecting the at least one datum of the second carriage rail from the first side thereof.

36. The method of claim 32, wherein the step of forming the plurality of datums includes forming a first datum and a second datum on the carriage and spacing the second datum from the first datum.

37. The method of claim 32, wherein the step of forming the plurality of datums includes forming a first pair of datums and a second pair of datums on the carriage and spacing the second pair of datums from the first pair of datums.

38. The method of claim 37, wherein the step of forming the plurality of datums includes offsetting the second pair of datums from the first pair of datums.

39. An inkjet printhead assembly adapted to be mounted in a mounting assembly including a plurality of datums, the inkjet printhead assembly comprising:

a carrier having two sides both adapted to contact a one of the plurality of datums of the mounting assembly and position the inkjet printhead assembly in three dimensions; and a plurality of printhead dies each mounted on the carrier.

40. The inkjet printhead assembly of claim 39, wherein the carrier has a first side and a second side parallel with the first side, the first side of the carrier adapted to contact a first of the plurality of datums and the second side of the carrier adapted to contact a second of the plurality of datums.

41. The inkjet printhead assembly of claim 40, wherein the carrier further has a third side and a fourth side both oriented at an angle to the first side and the second side of the carrier, the third side of the carrier adapted to contact the first of the plurality of datums and the fourth side of the carrier adapted to contact the second of the plurality of datums.

42. The inkjet printhead assembly of claim 39, wherein the carrier has a first notch formed in the first side thereof and a second notch formed in the second side thereof, the first notch adapted to receive a first of the plurality of datums and the second notch adapted to receive a second of the plurality of datums.

43. The inkjet printhead assembly of claim 39, wherein the carrier includes a first flange projecting from the first side thereof and a second flange projecting from the second side thereof, the first flange adapted to contact a first of the plurality of datums and the second flange adapted to contact a second of the plurality of datums.

* * * * *